US00RE38029E

(19) United States
(12) Reissued Patent
Cote et al.

(10) Patent Number: US RE38,029 E
(45) Date of Reissued Patent: Mar. 11, 2003

(54) WAFER POLISHING AND ENDPOINT DETECTION

(75) Inventors: William J. Cote, Essex Junction, VT (US); Michael A. Leach, Bristol, VT (US)

(73) Assignee: IBM Corporation, Armonk, NY (US)

(21) Appl. No.: 07/852,432

(22) Filed: Mar. 16, 1992

Related U.S. Patent Documents

Reissue of:
(64) Patent No.: 4,910,155
Issued: Mar. 20, 1990
Appl. No.: 07/263,842
Filed: Oct. 28, 1988

(51) Int. Cl.[7] ..... H01L 21/00; C23F 1/02
(52) U.S. Cl. ..... 438/16; 438/693; 156/345; 451/211
(58) Field of Search ..... 156/636, 637, 156/645, 626, 627, 345 LP, 345; 437/225, 228, 8, 7, 228 P; 51/7, 90, 317, 2 C, 165 R, 165.71, 165.74, 131.4; 451/1, 211; 216/88–90; 438/16, 693

(56) References Cited

U.S. PATENT DOCUMENTS

| | | | | | |
|---|---|---|---|---|---|
| 2,476,851 | A | * | 7/1949 | Folsom et al. | 451/1 |
| 2,922,264 | A | * | 1/1960 | Mushrush | 51/281 R |
| 3,342,652 | A | | 9/1967 | Reisman et al. | 156/17 |
| 3,436,286 | A | | 4/1969 | Lange | 156/636 |
| 3,615,955 | A | | 10/1971 | Regh | 156/636 |
| 3,841,031 | A | | 10/1974 | Walsh | 51/283 |
| 4,256,535 | A | | 3/1981 | Banks | 156/645 |
| 4,373,991 | A | | 2/1983 | Banks | 156/645 |
| 4,407,094 | A | * | 10/1983 | Bennett et al. | 51/165 R |
| 4,524,477 | A | * | 6/1985 | Williams, III et al. | 15/50 R |
| 4,561,214 | A | * | 12/1985 | Inoue | 51/165 R |
| 4,671,851 | A | | 6/1987 | Beyer et al. | 156/645 |
| 4,702,792 | A | | 10/1987 | Chow et al. | 156/628 |
| 4,710,264 | A | | 12/1987 | Waschler et al. | 437/228 |
| 4,757,566 | A | * | 7/1988 | Field et al. | 15/49 R |
| 4,944,836 | A | | 7/1990 | Beyer et al. | 156/645 |
| 4,956,313 | A | | 9/1990 | Leach | 437/228 |
| 5,213,655 | A | * | 5/1993 | Leach et al. | 156/627 |
| 5,217,566 | A | * | 6/1993 | Pasch et al. | 156/636 |
| 5,234,868 | A | * | 8/1993 | Cote | 156/626 |
| 5,250,897 | A | * | 10/1993 | DiIorio | 156/627 |
| 5,298,110 | A | * | 3/1994 | Schoenborn et al. | 156/626 |
| 5,308,438 | A | * | 5/1994 | Cote et al. | 156/627 |

FOREIGN PATENT DOCUMENTS

| | | | | |
|---|---|---|---|---|
| DE | 0147589 | | 4/1981 | 156/645 |
| EP | 0496303 | A1 * | 7/1992 | 451/1 |
| JP | 187153 | * | 3/1989 | |
| JP | 295563 | * | 4/1990 | |
| JP | 2124261 | * | 5/1990 | |

OTHER PUBLICATIONS

J. D. Warnock, "End Point Detector for Chemi–Mechanical Polisher," IBM Technical Disclosure Bulletin, vol. 31, No. 4, Sep. 1988, pp. 325–326.

Howard Strasbaugh, Inc., Maintenance Manual, pp. 8, 30–31 and Safety Instructions, Apr. 1987.

J.B. Brinton, "Spinning Etchant Polishes Flat, Fast," Electronics, Jan. 13, 1982, vol. 55, No. 1, pp. 40–41.

Y. Namba, et al., "Ultrafine Finishing of Ceramics and Metals by Float Polishing," Laser Induced Damage in Optical Materials: 1980, Proceedings of a Symposium (NBS–SP–620) Boulder, CO, Sep. 30–Oct. 1, 1980, pp. 171–179.

* cited by examiner

*Primary Examiner*—Richard Booth
(74) *Attorney, Agent, or Firm*—Sughrue Mion, PLLC

(57) ABSTRACT

In a chem-mech polishing process for planarizing insulators such as silicon oxide and silicon nitride, a pool of slurry is utilized at a temperature between 85° F.–95° F. The slurry particulates (e.g. silica) have a hardness commensurate to the hardness of the insulator to be polished. Under these conditions, wafers can be polished at a high degree of uniformity more economically (by increasing pad lifetime), without introducing areas of locally incomplete polishing.

42 Claims, 1 Drawing Sheet

WAFER POLISHING AND ENDPOINT DETECTION

Matter enclosed in heavy brackets [ ] appears in the original patent but forms no part of this reissue specification; matter printed in italics indicates the additions made by reissue.

BACKGROUND OF THE INVENTION

1. Technical Field

The invention relates to a method of planarizing workpieces utilizing an abrasive slurry in conjunction with a polishing pad.

2. Background Art

In the art of forming metallic interconnection layers on processed semiconductor substrates, it is known that various processing difficulties are presented if the primary passivation layer has an irregular topography. Such difficulties include unacceptable variations i metal layer thickness, which result in the possibility of undesired metal opens/shorts.

At first, this problem was dealt with by using a passivation material (such as phosphosilicate glass (PSG) or borophosphosilicate glass (BPSG)) that could be melted (or reflowed) to smooth out the upper surface. While this solution was perfectly acceptable for the device densities of the day, recent advances in integration have forced workers in the art to consider other alternatives. One such alternative is the socalled "planarizing etch-back" procedure, in which a layer of conventional photosensitive polymer (or "photoresist") is spin-applied on top of the passivation layer. The photoresist presents a planar upper surface. Then using an etch technique that is non-selective between the photoresist and the passivation layer, the layers are simultaneously etched such that the planar upper surface of the photoresist is transferred to the underlaying passivation layer. Such etch processes include sputter etches and reactive ion etches (RIE) in $CF_4$-$O_2$ plasmas. For example, see U.S. Pat. No. 4,710,264 (issued 12/1/87 to Waschler et al and assigned to Telefonken GmbH). This alternative has not been widely accepted in the art because it is very difficult to accurately determine etch endpoint.

Another alternative presently under consideration is the so-called "chem-mech polish" (CMP) process. In this process, passivated substrates are rotated against a polishing pad in the presence of an abrasive slurry. Typically the slurry is pH-controlled such that the etch rate of the passivation layer can be controlled. In U.S. Patent Application Ser. No. 791,860, entitled "Chem-Mech Polishing Method for Producing Co-Planar Metal/Insulator Films On a Substrate," filed Oct. 28, 1985, by Beyer et al and assigned to the assignee of the present invention, different slurry chemistries are used to optimize insulator-to-metal (or visa-versa) etch rate ratios to achieve a planar surface. For example, using an abrasive pad at a pressure of 2–8 PSI, and a slurry of 0.06 micron alumina particles in deionized water, a 1:1 etch rate ratio of metal:insulator was achieved. The metal etch rate increased (and the oxide etch rate decreased) as different acids are used to lower the pH to 2.2. Alternatively, by increasing the pH to 11–11.5, the insulator removal rate increased relative to metal when using silica particulates at a concentration of 1–10 weight. In U.S. Patent Application Ser. No. 085,836 entitled "Via Filling and Planarizing Technique," filed Aug. 17, 1987, by Cote et al and assigned to the assignee of the present invention, an alumina/deionized water/hydrogen peroxide slurry was used utilizing a pressure of 10–12 PSI to provide a planarized tungsten-BPSG surface, such that filled vias and a planarized passivation layer were simultaneously formed. See also U.S. Pat. No. 4,702,792 (issued 10/27/87 to Chow et al and assigned to IBM), in which a polymer film is chem-mech polished to define an image pattern.

In the above chem-mech polishing art, the amount of slurry is kept to a minimum. Typically, the slurry is applied by a dropper suspended above the center of the polish wheel. As the wheel spins, the slurry is spread over the polish pad. Examples of low slurry content polishing are shown in U.S. Pat. No. 3,841,031, entitled "Process for Polishing Thin Elements"; U.S. Pat. No. 3,342,652, entitled "Chemical Polishing of A Semi-Conductor Substrate"; U.S. Pat. No. 4,256,535, entitled "Method of Polishing a Semiconductor Wafer"; U.S. Pat. No. 4,373,991, entitled "Method and Apparatus for Polishing A Semiconductor Wafer"; and an article entitled "Spinning Etchant Polishes Flat, Fast" Electronics, Jan. 13, 1982, pp. 40–41.

Use of low slurry content polishing leads to several difficulties. One difficulty is shortened polish pad "lifetime." Pad lifetime relates to the total number of wafers that can be polished by a given pad. As the pad wears out, both the removal rate of the polished material and the uniformity of removal across the wafer substantially degrade. Pad lifetime is determined by the hardness of the pad, the polish conditions, and the break-in/conditioning procedures. Typically, in order to provide sufficient wetting of a polishing pad used in conjunction with a small amount of slurry, the pad must undergo a destructive break-in procedure (e.g., high-pressure scraping using a blade), as well as periodic conditioning (lower pressure scraping). Such procedures substantially reduce pad lifetime, such that the overall process is more expensive due to the frequency of pad replacement.

Another difficulty is the lack of removal rate uniformity across a given wafer. Using low slurry content processes, the inventors tried to optimize uniformity by changing the slurry content as well as varying the hardness of the pad. None of these changes appreciably enhanced uniformity.

Yet another difficulty is the occurrence of "bumps." Bumps are areas along the substrate having locally incomplete polishing. Typically they occur over areas that cover steep topologies. For example, when polishing an oxide passivation layer on top of a gate electrode, if the electrode provides a steep "step" (i.e., if it has a height more than approximately 0.5 microns), bumps will tend to form on the portion of the oxide above the edges of the electrode. In low slurry content applications, bumps cannot be eliminated without adversely affecting some other parameter (e.g., rate uniformity, pad life) that needs to be optimized.

Accordingly, there is a need in the art for a planarization process in which both pad lifetime and polish rate uniformity can be maximized while simultaneously minimizing the occurrence of bumps.

SUMMARY OF THE INVENTION

It is thus an object of the invention to provide a chem-mech planarization process that maximizes both pad lifetime and planarization uniformity.

It is another object of the invention to optimize the above parameters while simultaneously minimizing the occurrence of bumps.

It is yet another object of the invention to provide a chem-mech polishing process wherein the need to selectively introduce different slurries is eliminated.

The above and other objects have been met by arranging a retaining wall about the polishing table, and introducing a pool of slurry that completely immerses the polish pad. Moreover, the slurry temperature is raised above room temperature.

By utilizing a polishing process under the above conditions, polish uniformity is in the range of 97%. At the same time, pad lifetime is appreciably extended (up to 10×) because a less vigorous break-in procedure may now be used. Finally, these enhancements do not come at the expense of increased occurrence of bumps; rather, bumps are eliminated.

BRIEF DESCRIPTION OF THE DRAWING

The above and other aspects of the invention will be described in more detail below. In the description to follow, reference will be made to the accompanying Drawing, in which.

DESCRIPTION OF THE BEST MODE FOR CARRYING OUT THE INVENTION

Figure 1:
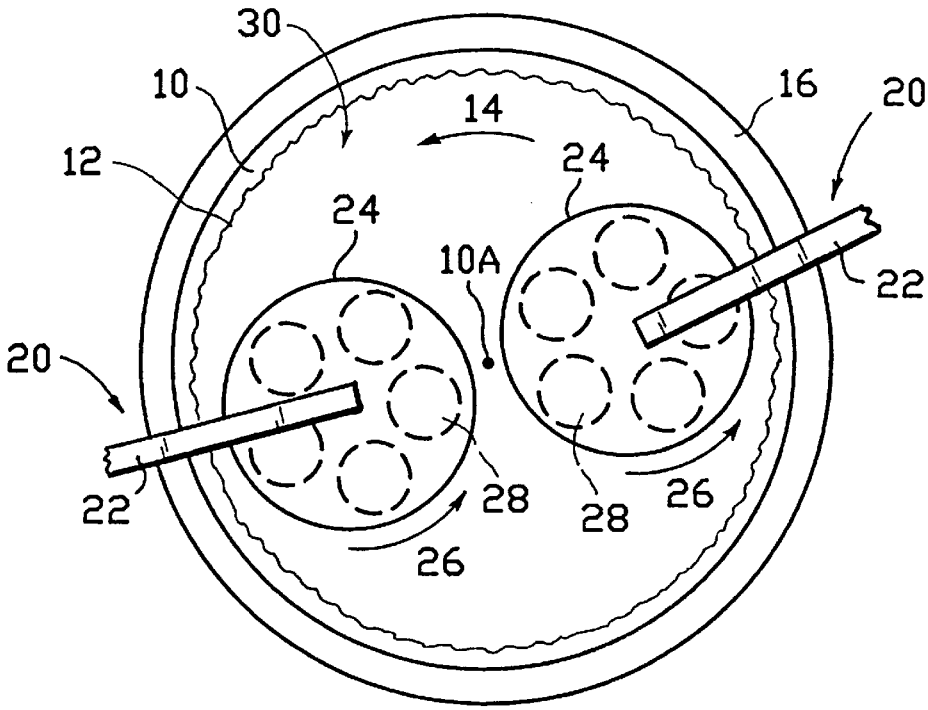
FIG. 1 is a top view of the polishing apparatus of the invention.
Figure 2:
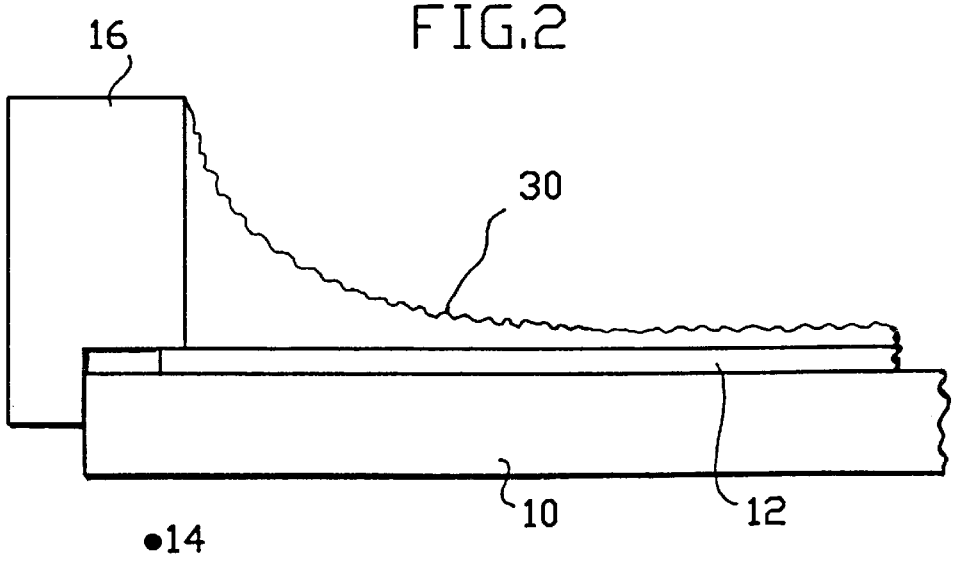
FIG. 2 is a cross-sectional view of the polishing apparatus of the invention.

With reference to FIGS. 1 and 2, the invention is carried out on a rotating polish wheel 10 having a circular polishing pad 12 mounted thereon. The polishing wheel 10 rotates in a direction indicated by arrow 14. There are a number of commercial polish wheels upon which the invention can be carried out. The inventors have practiced the invention on a polish tool Model No. 6CU sold by the Strasbaugh Co. of Huntington Beach, CA.

Disposed about the periphery of polish wheel 10 is a retaining wall (or dam) 16. The purpose of the dam 16 is to increase the amount of slurry 30 provided to the polish pad 12, to the point where a slurry "pool" 30 is formed which is sufficient to completely cover the pad 12 even when it is spinning during the polishing process. See Namba et al, "Ultrafine Finishing of Ceramics and Metals by Float Polishing." Laser Induced Damage in Optical Materials" Conference Proceedings 1980, pgs. 171–179. See also U.S. Pat. No. 2,922,264. In the present invention, the dam is two inches high, such that a slurry pool approximately ¼ inch deep is formed covering the polish pad 12.

The wafers 28 to be planarized are held against the spinning polish wheel 10 by a quill assembly 20. The quill assembly includes a moveable support arm 22 for bringing the wafer 28 into contact with the polish pad 12, and a wafer support 24 that spins in a direction indicated by arrow 26. Note that the wafer support 26 is rotated by a belt assembly (not shown) disposed within support arm 22. The support 24 has an elastomeric pad (not shown) disposed within it for receiving the wafer 28. Thus, the wafers 28 are polished by the action of the spinning support 24, the spinning pad 12, and the slurry pool 30 disposed therebetween.

When utilizing large slurry amounts, the inventors have found that both greater uniformity and prolonged pad life results. Specifically, under these conditions polish uniformity across the surface of a wafer can be as high as 97%. At the same time, polish pad lifetime is increased because a less vigorous break-in procedure can be used. Specifically, break-in can now be performed by polishing a number of blank wafers having an exposed coarse film thereon for a relatively short amount of time (e.g. five minutes). The amount of wafers is a function of polish pad hardness (the harder the pad, the less break-in is needed). For a very hard polish pad (e.g., the IC-40 pad sold by Rodel Corp. of Scottsdale, AZ), no break-in is necessary in this process.

In carrying out experiments utilizing the polish apparatus discussed above, the inventors found that the temperature of the slurry plays a significant role in polish uniformity. Specifically, by raising the slurry temperature from room temperature to 85–95° F., the uniformity of the planarization etch was greatly improved, by up to a factor of two in some experiments. These findings were not anticipated, particularly in polishing layers such as oxides where the process is predominantly mechanical in nature. Moreover, after this phenomena was uncovered, the inventors expected that it would hold (and even increase) as a function of increased temperature. However, the inventors found that at temperatures above approximately 95–100° F., uniformity substantially degrades. The inventors postulate that at these higher temperatures, non-uniformity increases because it is very difficult to maintain constant slurry concentration due to evaporation. In other words, above approximately 100° F., increases in polish uniformity are negated by slurry non-uniformity.

The inventors have found that the percentage of particulates in the slurry, plays a role in the overall process. Specifically, the inventors found that when utilizing a pool of silica slurry, the polishing rate of the substrates increases (and the occurrence of bumps decreases) linearly with increasing solids percentage up to 10%. Above 10%, both polish rate and polish rate uniformity stay essentially constant, and bumps are at a minimum. Experiments indicate that above approximately 15 weight percent solids, polish rate uniformity degrades. When polishing in the presence of a small amount of slurry, both polish rate and polish rate non-uniformity increase with increasing solids percent. In other words, there is no appreciable operating "window" within which both polish rate and polish rate uniformity can be maximized by percent solids.

The size of particulates also plays a role in the overall process. The inventors thought bumps were caused by small non-uniformities in the particulate concentration within the slurry. They tried to eliminate bumps by using a slurry having small (0.006 micron average size) particulates, on the assumption that smaller particulates would enhance the effective particulate concentration. Bumps continue to occur. When the size of the particulates was increased to 0.02 microns, bumps were eliminated. These results were achieved at removal rates between approximately 500 and 1500 angstroms per minute. Above approximately 2000 angstroms per minute, bumps could not be eliminated. Note that this removal rate limit is for blanket layers; in practice, when planarizing passivation layers overlaying steep topographies, localized removal rates of up to 6000 angstroms per minute have been achieved without bumps.

Moreover, by utilizing a pool of slurry, large particulates can be used for all polish applications, including those in which slurries having fine particulates are ordinarily used. In the invention, the slurry has been diluted in water to 12% (by weight) $SiO_2$ particulates (average diameter of 0.02 microns) suspended in water. The slurry is sold under the trade name "Cab-0-Sperse SCl" by Cabot Corp. Normally, a slurry having much smaller particulates would be used in situations in which only a small amount of material is to be polished away, and/or the underlaying surface is particularly sensitive to scratching (e.g., in polishing a thin silicon dioxide layer atop a polish-stop layer formed on a silicon substrate, we wish to avoid dislocations in the silicon crystallography that can result from scratching the silicon surface). The inventors found that by utilizing a pool of slurry at an elevated temperature, the mechanism by which particulate size contributes to scratching is eliminated. Thus, under these conditions scratching becomes a sole function of pad hardness (the harder the pad, the more scratches). In low slurry applications, softer pads could not be used because bumps would occur; this problem could only be alleviated by utilizing the destructive pad break-in/conditioning procedures previously discussed. Here, one can use a softer pad without producing bumps and without utilizing such pad break-in/conditioning procedures. Thus, the same coarse slurry can now be used in conventional fine slurry applications, reducing expense by eliminating the need to change slurries as a function of coarse/fine application.

Further, in utilizing a pool of slurry, the spin speed of both the table 10 and the quill 20 is reduced from 120 RPM to 15–30 RPM. Under these conditions, endpoint detection is facilitated. For example, when polishing oxide on a silicon wafer, it has been observed that silicon is much less susceptible to polishing. This means that when the silicon surface rubs against the polish wheel, it produces a far greater amount of drag than does the oxide. The inventors have taken advantage of this phenomenon to provide an accurate endpoint detection method. When multiple wafers are being polished, a monitor (or dummy) wafer is included. The dummy wafer is a silicon substrate having the same amount of oxide on it as the amount of oxide on the product wafers to be removed by polishing. Once the oxide is removed [form] *from* the dummy wafer, the exposed silicon surface provides a large amount of drag. This maximum drag can be detected with a quill motor current detector. The motor controller is set to allow the quill to slow down at maximum drag. The controller senses that the motor rotation speed is too low and the motor current increases sharply, producing a current "spike." Thus, process endpoint is signaled by current spikes in the motor that turns the quill.

The above technique is applied to lower quill spin speeds, because at higher speeds the increased drag is less pronounced due to the increased angular momentum of the wafer.

The invention will now be discussed with reference to Example 1 below:

EXAMPLE 1

Purpose: To planarize a step height of approximately 8000Å of undoped oxide passivating a processed silicon substrate.

slurry: Cab-0-Sperse SCl, diluted in water to 12 weight percent quill spin speed: 17 RPM quill pressure: 9 PSI polish pad: Rodel Suba 500 polish wheel spin speed: 17 RPM slurry temperature: 90° F.

number of wafers: 9, plus endpoint detection wafer

Results: After 7 minutes, oxide is completely planarized on the silicon surface, without bumps or scratching.

Thus, in the invention, a pool of slurry is used in which the temperature is raised above room temperature, such that both polish rate uniformity and pad lifetime are maximized without promoting bumps. These advantages of the invention can be realized whenever insulators such as silicon oxide or silicon nitride are to be polished. Moreover, the advantages of the invention are not limited to the best mode embodiment described above; for example, other particulates having hardnesses commensurate with the hardness of the insulator to be polished can be used.

We claim:

1. In a process of chem-mech polishing an insulator layer arranged on a semiconductor wafer, wherein the wafer is brought into contact with a rotating polish wheel having a polishing pad disposed thereon, the improvement comprising:

providing sufficient slurry to form a pool defined by a dam disposed about the outer periphery of the polish wheel, wherein said polishing pad is immersed in said pool during polishing, and wherein said slurry comprises a liquid suspension of solid particulates having a hardness commensurate to the hardness of the insulator layer; and elevating the temperature of said slurry to at least approximately 85° F.

2. The process as recited in claim 1, wherein said slurry is at a temperature between approximately 85° F.–95° F.

3. The process as recited in claim 1, wherein said solid particulates have an average size of at least 0.02 microns.

4. The process [is] *as* recited in claim 1, wherein said solid particulates constitute approximately 10%–15% by weight of said slurry.

5. The process as recited in claim 4, wherein said particulates are comprised of $SiO_2$.

6. The process as recited in claim 1, wherein said polish wheel rotates at a speed no greater than approximately 30 RPM.

7. The process as recited in claim 6, wherein said polish wheel rotates at a speed between approximately 15 RPM–20 RPM.

8. The process as recited in claim 6, wherein a plurality of semiconductor wafers are simultaneously polished by being brought into contact with the same polish wheel.

9. The process as recited in claim 8, wherein at least one of said wafers is a dummy wafer comprising a silicon substrate with a discrete layer thereon having a thickness commensurate to the amount of material to be removed from the remaining wafers.

10. The process as recited in claim 9, further comprising:

monitoring said dummy wafer during polishing to indicate when the polishing process is completed.

11. In a process of chem-mech polishing an insulator layer arranged on a semiconductor wafer, wherein the wafer is brought into contact with a rotating polish wheel having a polishing pad disposed thereon, the improvement comprising:

providing sufficient slurry to form a pool defined by a dam disposed about the outer periphery of the polish wheel, wherein said polishing pad is immersed in said pool during polishing, and wherein said slurry comprises a suspension of silica particulates having an average size greater than 0.006 microns, said silica particles comprising approximately 10%–15% by weight of said slurry; and elevating the temperature of said slurry to at least approximately 85° F.

12. The process as recited in claim 11, wherein said silica particulates have an average size of approximately 0.01 microns.

13. The process as recited in claim 12, wherein said polish wheel rotates at a speed no greater than approximately 30 RPM.

14. The process as recited in claim 13, wherein said polish wheel rotates at a speed between approximately 15 RPM–20 RPM.

15. The process as recited in claim 13, wherein a plurality of semiconductor wafers are simultaneously polished by being brought into contact with the same polish wheel.

16. The method as recited in claim 15, wherein at least one of said wafers is a dummy wafer comprising a silicon substrate with a discrete layer thereon having a thickness commensurate to the amount of material to be removed from the remaining wafers.

17. The method as recited in claim 16, further comprising:

monitoring said dummy wafer during polishing to indicate when the polishing process is completed.

18. In a process of chem-mech polishing a layer of silicon oxide disposed on a semiconductor substrate, wherein the substrate is supported by a quill in contact with a rotating polish wheel having a polishing pad disposed thereon, the improvement comprising:

providing an amount of slurry sufficient to form a pool defined by a dam disposed about the polish wheel, wherein said polishing pad is immersed in said pool during polishing, and wherein said slurry comprises a suspension of approximately 10%–15% silica particulates by weight, said particulates having an average diameter of at least approximately 0.02 microns; and elevating the temperature of said slurry to at least approximately 85° F.; and wherein said polish wheel rotates at a speed no greater than approximately 30 RPM.

19. The process as recited in claim 18, wherein said slurry is at a temperature between approximately 85° F.–95° F. and said polish wheel rotates at a speed between approximately 15 RPM–20 RPM.

20. The process as recited in claim 19, wherein:

a plurality of semiconductor wafers are simultaneously polished by being brought into contact with the same polish wheel; and at least one of said wafers is a dummy wafer comprising a silicon substrate with a discrete layer thereon having a thickness commensurate to the amount of material to be removed from the remaining wafers;

and further comprising:

monitoring said dummy wafer during polishing to indicate when the polishing process is completed.

*21. In a process of chem-mech polishing a layer of oxide disposed on a semiconductor substrate, wherein the substrate is supported by an electric motor driven quill in contact with a rotating polish wheel having a polishing pad thereon, the improvement comprising:*

*monitoring the process endpoint by detecting current changes in the motor driving the quill.*

*22. The process of claim 21 wherein the substrate is silicon and the monitoring process comprises (a) setting a motor controller, coupled to the motor driven quill, to allow the quill rotation speed to decrease, when the polishing pad has increased drag thereon by encountering the silicon substrate, and (b) sensing an increase in current in the motor caused by the decrease in the rotational speed of the quill.*

*23. The process of claim 22 wherein said setting step is performed so that the increase in the current occurs as a current spike.*

*24. In a chem-mech polishing apparatus having a rotating polishing wheel with a quill assembly for supporting an oxide coated semiconductor substrate in contact with the polishing wheel, said quill assembly being driven by an electric motor, the improvement comprising:*

*means for determining a polishing endpoint, said means comprising a current detector for detecting a change in current drawn by the electric motor driving the quill assembly.*

*25. The apparatus of claim 26 further comprising means for stopping polishing when said current detector detects said change in current.*

*26. A method for planarizing a semiconductor wafer comprising:*

*a. holding a semiconductor wafer in contact with a polishing platen in the presence of a chemical slurry;*

*b. rotating the wafer with respect to and against the polishing platen with an electric drive motor; and*

*c. sensing the change in friction between the wafer and the polishing platen to detect the planar endpoint on said wafer with a current meter for the drive motor which detects a change in amperage through the drive motor.*

*27. The process as claimed in claim 26 and wherein:*

*sensing the planar endpoint occurs when an oxide coating on the wafer is planarized and a surface of the wafer including a different material is contacted by the polishing platen.*

*28. The process as claimed in claim 26 and wherein;*

*the current meter measures a current flow to the drive motor which is proportional to the torque output of the drive motor divided by a multiplying factor equal to the distance between the wafer and the center of the polishing platen.*

*29. The process as claimed in claim 28 and wherein:*

*torque (T) on the motor is equated to the force (F) exerted on the wafer by the polishing platen in a direction of relative motion of the wafer and the polishing platen and to the radius (r) of the wafer from the center of the polishing platen by the formula: $T=F\times r$.*

*30. A method of detecting a planar endpoint on a semiconductor wafer during a chem-mech planarization process comprising:*

*a. rotating the wafer with respect to the polishing platen by an electric motor; and*

*b. sensing a change in friction between the wafer and polishing platen by detecting a change in current in a current meter for the motor.*

*31. The method as recited in claim 30 and wherein:*

*the planar endpoint occurs when coating on the wafer is removed to expose a surface formed with a different material.*

*32. The method as recited in claim 31 and wherein:*

*both the wafer and polishing platen are moved.*

*33. The method as recited in claim 30 and wherein:*

*the coefficient of friction between the wafer and polishing platen is related to the torque (T) on the motor according to the equation $T=F\times r$, wherein "F" is a force exerted by the polishing platen on the wafer in a direction of relative motion of the polishing platen and the wafer and is a function of the coefficient of friction between the wafer and the polishing platen, and "r" is a radius from the center of the polishing platen to the center of the wafer.*

*34. In a chem-mech planarization apparatus for a wafer having a polishing head for holding and moving the wafer against a movable polishing platen in a polishing slurry, an endpoint detection apparatus comprising:*

*means for determining a polishing endpoint by detecting a current change to a drive motor for moving the polishing head, wherein said change occurs with a change in friction between the wafer and the polishing platen.*

*35. Endpoint detection apparatus as claimed in claim 34 and wherein:*

*said change in friction occurs when a coating of the wafer is removed and a surface formed of a different material is contacted.*

*36. Endpoint detection apparatus as claimed in claim 34 further comprising:*

*control means responsive to said determining means for controlling the planarization apparatus.*

*37. Endpoint detection apparatus as claimed in claim 36 and wherein:*

*both the polishing head and the polishing platen are rotated and the wafer is moved across the polishing platen.*

*38. Endpoint detection apparatus as claimed in claim 36 and wherein:*

*said control means measures a distance "r" from the center of the polishing head to the center of the polishing platen, to be used by the control means as a multiplying factor for determining a torque (T) on the drive motor according to the formula* $T=F\times r$*, where (F) is a force exerted by the polishing platen against the wafer in a direction of relative movement of the polishing platen and the wafer.*

*39. Apparatus for chem-mech planarizing a semiconductor wafer and for detecting a planar endpoint of the wafer comprising:*

*a. holding means for holding and moving the wafer including a polishing head rotated by a first electric drive motor;*

*b. polishing means including a polishing platen rotated by a second electric drive motor and a polishing agent for contact with the wafer and with the polishing platen; and*

*c. means for determining a planar endpoint, comprising a current meter for measuring current in the first electric drive motor, whereby a change in friction between the wafer and the polishing platen is detected by a change in motor current and equated to the planar endpoint.*

*40. Apparatus as recited in claim 39 and wherein:*

*the planar endpoint occurs when an oxide coating is removed from the wafer and a surface including a different material is exposed.*

*41. Apparatus as recited in claim 39 and wherein:*

*the polishing head and the polishing platen are rotated in the same direction.*

*42. Apparatus as recited in claim 39 and further comprising:*

*control means, responsive to said determining means, for controlling the apparatus.*

* * * * *